(12) United States Patent
Thewes et al.

(10) Patent No.: US 6,487,109 B2
(45) Date of Patent: Nov. 26, 2002

(54) MAGNETORESISTIVE MEMORY AND METHOD FOR READING A MAGNETORESISTIVE MEMORY

(75) Inventors: Roland Thewes, Gröbenzell (DE); Werner Weber, München (DE); Hugo Van Den Berg, Diethoorn (NL)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/946,941

(22) Filed: Sep. 4, 2001

(65) Prior Publication Data

US 2002/0048185 A1 Apr. 25, 2002

(30) Foreign Application Priority Data

Sep. 4, 2000 (DE) .......................... 100 43 440

(51) Int. Cl.[7] .............................................. G11C 11/00
(52) U.S. Cl. ...................................... 365/158; 365/173
(58) Field of Search ............................ 365/158, 171, 365/173, 149, 189.08, 189.09

(56) References Cited

U.S. PATENT DOCUMENTS 5,654,566 A * 8/1997 Johnson ...................... 257/295
5,825,685 A * 10/1998 Yamane et al. .............. 365/158
6,388,916 B1 * 5/2002 Johnson ...................... 257/295

FOREIGN PATENT DOCUMENTS

| DE | 199 14 488 C1 | 5/2000 |
| DE | 199 47 118 C1 | 3/2001 |
| WO | WO 99/14760 | 3/1999 |
| WO | WO 00/42614 | 7/2000 |

\* cited by examiner

*Primary Examiner*—Richard Elms
*Assistant Examiner*—Hien Nguyen
(74) *Attorney, Agent, or Firm*—Laurence A. Greenberg; Werner H. Stemer; Ralph E. Locher

(57) ABSTRACT

A magnetoresistive memory includes magnetoresistive memory cells disposed in a plurality of rows and/or columns. A bit line is connected to first poles of the memory cells of a column. A word line is connected to second poles of the memory cells of a row. A read voltage source is separately connectable to first ends of the word lines. A voltage evaluator has at least one input that is separately connectable to first ends of the bit lines via an evaluation line. A first terminating resistor branches from the evaluation line. An impedance converter has an input connected to the evaluation line and has an output separately connectable to second ends of the bit lines and word lines. The invention also relates to a method of reading magnetoresistive memories.

22 Claims, 3 Drawing Sheets

MAGNETORESISTIVE MEMORY AND METHOD FOR READING A MAGNETORESISTIVE MEMORY

BACKGROUND OF THE INVENTION

Field of the Invention

The invention relates to a magnetoresistive memory and a method of reading memory cells in such a magnetoresistive memory.

Magnetoresistive memories represent an alternative to conventional DRAMs (Dynamic Random Access Memories) and SRAMs (Static Random Access Memories) and non-volatile memories such as flash memories or EEPROM (Electrically Erasable Programmable Read Only Memory). They are formed of a configuration of memory cells to which bit lines and word lines are linked. The individual memory cells of a magnetoresistive memory are formed of two magnetic elements separated by a dielectric. One of the magnetic elements is hard-magnetic and therefore has a fixed direction of flux, whereas the other is soft-magnetic, and its orientation can be reversed by applying appropriate switching currents to the bit lines and word lines. The dielectric between the two magnetic elements is known as a tunnel dielectric, for instance a layer with a thickness of 2 nm, which is suitable as a tunnel dielectric. The specific feature of a tunnel dielectric is that its resistance depends on the magnetic field surrounding it. When the two magnetic elements on either side of the tunnel dielectric are oriented in the same direction, the dielectric has a different resistance value than when the magnetic flux directions of the two magnetic elements are the inverse of one another. By applying a suitable voltage to the bit lines and word lines, the instantaneous value of the resistance in the tunnel dielectric can be determined, and thus the orientation of the magnetic elements can be deduced. Thus, an overall binary state system is produced, which is suitable for storing digital information.

In such a configuration of memory cells, it is possible to provide parallel bit lines and word lines over and under the actual memory cells, that are in turn provided at a right angle to each other. At the margin of the memory cell configuration, the bit lines and word lines can then be carried over into additional circuits for writing and reading.

Arrays of MRAM (Magnetoresistive Random Access Memory) mass memories have not yet been presented as products. only smaller configurations (arrays) are available, which are usually based on the "current in-plane" principle, whereas the "current perpendicular to plane" principle holds better prospects for mass memory applications.

Magnetoresistive memories offer particular fundamental advantages, such as simple production, non-volatile data maintenance, and good shrink suitability. Their suitability as mass memories is largely dependent upon whether sufficiently large memory cell blocks can be realized. Arrays of competitive mass memories must simultaneously satisfy the following requirements:

1. The array must allow a size of several hundred by several hundred memory cells.

2. The read signal must have a definite minimum size in order to make possible a sufficiently reliable evaluation. Examples of Semiconductor Products:

DRAMs require approx. 100–150 mV. They perform voltage evaluation at the array margin using read amplifiers, which sit in the pitch.

Flash memories (embedded) require approx. 10 $\mu$A. They carry out current evaluation with read amplifiers in the periphery. SRAMs work with on-currents of 150 $\mu$A and negligible off-currents. They achieve array access times of from 600 ps to 1.2 ns.

Precise values cannot be given in advance for an MRAM; rather, it must be checked on a case-by-case basis whether the read signal is sufficient for a reliable evaluation, which is insensitive to noise. In any case, read amplifiers are not needed in the pitch. This relaxes the requirements.

3. The energy consumption in the read operation should be comparable to that of a DRAM or lower (1 pJ to 1 nJ, depending on the architecture).

These requirements also apply to a mass memory application of MRAMs.

In the prior art, various suggestions have been made for configuring magnetoresistive memory cell configurations. But the amplifier circuits put forward there tend to exhibit stability problems in practice.

SUMMARY OF THE INVENTION

It is accordingly an object of the invention to provide a magnetoresistive memory and a method of reading or operating a magnetoresistive memory which overcome the above-mentioned disadvantages of the heretofore-known methods and devices of this general type and which allows a suitable architecture for reliably writing, reading, and erasing magnetoresistive memory cells in arrays of such cells, i.e. in magnetoresistive memories.

With the foregoing and other objects in view there is provided, in accordance with the invention, a magnetoresistive memory, including:

magnetoresistive memory cells having respective first poles and second poles and being disposed in an array formed by rows and columns;

bit lines assigned to the columns, the bit lines being connected to the first poles of the magnetoresistive memory cells disposed in associated ones of the columns, the bit lines having first ends and second ends;

word lines assigned to the rows, the word lines being connected to the second poles of the magnetoresistive memory cells disposed in associated ones of the rows, the word lines having first ends and second ends;

a read voltage source;

first switching elements connected such that the read voltage source is separately connectable to the first ends of the word lines via the first switching elements;

an evaluation line;

second switching elements;

a voltage evaluator having at least one input, the at least one input being separately connectable, via the evaluation line, to the first ends of the bit lines by the second switching elements;

a first terminating resistor branching from the evaluation line;

third switching elements; and an impedance converter having an input connected to the evaluation line and having an output separately connectable to the second ends of the bit lines and the word lines with the third switching elements.

The invention is based on the idea of generating a voltage which is dependent on the resistance of a memory cell that is being read, and making this voltage so loadable through the use of an impedance converter that the word lines and bit lines can be sufficiently held at a stable voltage level.

In other words, the invention is thus first aimed at a magnetoresistive memory which includes: a configuration of magnetoresistive memory cells in several rows and/or several columns; a bit line for each of the columns, which is connected to first poles of the memory cells belonging to the column; a word line for each of the rows, which is connected to second poles of memory cells belonging to the row; a read voltage source, which is separately connectable to first ends of the word lines by switching elements; a voltage evaluator, whose at least one input is separately connectable to first ends of the bit lines by switching elements, by way of an evaluation line; whereby a first terminating resistor branches from the evaluation line. The inventive magnetoresistive memory is characterized by an impedance converter, whose input is connected to the evaluation line and whose output is separately connectable the second ends of the bit lines and word lines by switching elements.

The plurality of memory cells, which are organized in an array includes rows and columns. Because, in order to execute the inventive method, and thus in order to inventively utilize the impedance converter, a voltage is applied to word lines and bit lines which are not connected to the memory cell that is being read, it is necessary to provide more than one line at least in one of the two given dimensions, i.e. in rows or columns. Two is thus the minimum number of memory cells with which it is practical to apply the invention. Of course, a higher number of memory cells is desirable, which will typically be given in practice.

The read voltage source, which is connectable to the word lines, is in the position to supply a sufficient voltage to the active word line(s) to allow evaluation of the voltage still present at the voltage evaluator by same. The first terminating resistor, which branches from the evaluation line, is thus connected parallel to the voltage evaluator. Thus, the same voltage is present at the terminating resistor and the voltage evaluator. The magnitude of the voltage derives from the relation of the first terminating resistor to the instantaneous resistance value in the memory cell, which is being read.

An impedance converter in the sense of the present invention is also referred to as a V=1 amplifier or a voltage follower without level shift or offset. It does not change the voltage at its input (which is identical to the voltage dropping across the first terminating resistor), but rather delivers an identical voltage at its output, though the signal pending there is a low-resistance signal and therefore loadable. Thus, a sufficiently low-resistance voltage source is available to apply an identical voltage to the word lines and bit lines, which are provided for this purpose.

A terminating resistor refers to a resistor, one of whose poles is connected to the voltage being evaluated and the other of whose poles is connected to a reference voltage. As a rule, the reference voltage is GND, though it may also be another voltage, for instance one, which is higher than that of the read voltage source. In that case, the circuit must be adapted, accordingly, which is a familiar measure to the person skilled in the art.

The magnetoresistive memory can be advantageously constructed such that the evaluation line includes a terminal line for connecting to the bit lines, and two evaluation paths which are separately connectable to the terminal line with the aid of switching elements, with a respective terminating resistor branching from each of the evaluation paths, whereby each of the two evaluation paths is connectable, by a respective switching element, to an input of the voltage evaluator and a capacitor which is parallel thereto, and each of the two evaluation paths is connectable, by a respective switching element, to the input of the impedance converter and a capacitor which is parallel to this input.

This preferred configuration of elements effectively produces two evaluation paths instead of the one path described above, each of which is connectable to the bit lines which are critical for reading the memory cell, and to the impedance converter and the voltage evaluator as well. This way, it is possible to perform two independent evaluations of the resistance at the memory cell, which is being read.

The two terminating resistors can have an identical resistance value or different values. The two capacitors serve to temporarily store the emerging voltages during the measuring process, so that a comparison of the two voltages can be carried out in a corresponding voltage evaluator with two inputs. The configuration of two independent evaluation paths makes it possible to evaluate a memory cell twice and to form an average value from which the resistance value, and thus the binary meaningful content of the memory cell, can be determined with greater accuracy.

But it is also possible to insert a changeover or switching attempt between the two evaluations in order to be able to deduce the former binary state of the memory cell being read from a potentially occurring change of the resistance value of the memory cell. In order to be able to carry out such a switching attempt, the inventive magnetoresistive memory advantageously also includes: a first write current source, which is separately connectable to the first ends of the word lines with the aid of switching elements; and a second write current source, which is separately connectable to the first ends of the bit lines with the aid of switching elements. Such a switching attempt in a particular direction can be carried out by the write current sources in connection with the application of a voltage, which is made available by the impedance converter, to the memory cell being read.

As described, the read voltage source, the write current sources, the output of the impedance converter, and the evaluator line with the appertaining evaluator paths must be separately connectable to the utilized ends of the word lines and bit lines. To this end, distributors are provided, which bring the incoming and outgoing signals and voltages to the various word lines and bit lines. The distributors are a matter of branched interconnect systems, at whose ends the switching elements for connecting to the word lines and bit lines are expediently disposed. Accordingly, the connection of the bit lines to the evaluation line can be accomplished by an evaluator distributor including a switching element for each of the bit lines. The connection of the bit lines to the second write current source can likewise be accomplished through the use of the evaluator distributor, whereby the second write current source and the evaluator line are connectable to the evaluator distributor through the use of switching elements. The switching elements for connecting the write current source and the evaluator conductor to the evaluator distributor serve to allow the alternative production of one of the two contacts, since it is not practical to have a direct electrical connection between the evaluator circuit and the write current source.

The connection of the output of the impedance converter to the bit lines and word lines can be accomplished by way of a buffer distributor which is equipped with a switching element for each bit line and word line.

Likewise, the connection of the read voltage source to the word lines can be accomplished by way of a read distributor, likewise with a switching element for each word line.

Finally, the connection of the first write current source to the word lines can be accomplished by way of the read distributor, whereby the first write current source and the read voltage source are connectable to the read distributor with the aid of switching elements, in a similar fashion as the second write current source and the evaluator line described above.

The above-mentioned switching elements are at least partly, but preferably fully, constructed as transistors. The utilized magnetoresistive memory cells are expediently what are known as vertical voltage memory cells (current perpendicular to plane). In these, the memory elements of bit line, first magnetic element, tunnel dielectric, second magnetic element, and word line are disposed on top of one another vertically relative to a surface in an integrated circuit (with respect to its silicon structures). In the evaluation process, the current flows from top to bottom or from bottom to top.

According to another feature of the invention, the evaluation line includes a terminal line for providing a connection to the bit lines and includes two evaluation paths; fourth switching elements are provided such that the two evaluation paths are separately connectable to the terminal line by the fourth switching elements; the first terminating resistor branches from a first one of the two evaluation paths, a second terminating resistor branches from a second one of the two evaluation paths; each of the two evaluation paths is connectable to a respective input of the voltage evaluator and to a respective capacitor, connected in parallel thereto, by a respective fifth switching element; and each of the two evaluation paths is connectable to the input of the impedance converter and to a further capacitor, connected in parallel to the input of the impedance converter, by a respective sixth switching element.

According to another feature of the invention, a first write current source is separately connectable to the first ends of the word lines via given ones of the first switching elements and via a fourth switching element; and a second write current source is separately connectable to the first ends of the bit lines via given ones of the second switching elements and via a fifth switching element.

According to yet another feature of the invention, an evaluator distributor is provided for connecting the bit lines to the evaluation line via given ones of the second switching element provided for each of the bit lines.

According to another feature of the invention, an evaluator distributor is provided for connecting the bit lines to the second write current source, and the second write current source and the evaluation line are connectable to the evaluator distributor via further switching elements.

According to a further feature of the invention, a buffer distributor is provided for connecting the output of the impedance converter to the bit lines and the word lines via the third switching element provided for the bit lines and the word lines.

According to another feature of the invention, a read distributor is provided for connecting the read voltage source to the word lines via given ones of the first switching elements provided for the word lines.

According to another feature of the invention, a read distributor is provided for connecting the read voltage source to the word lines via given ones of the first switching elements provided for the word lines, the read distributor further connecting the first write current source to the word lines, the first write current source and the read voltage source being connectable to the read distributor via a given one of the first switching elements and the fourth switching element.

According to another feature of the invention, the first, second, and third switching elements are transistors.

The invention is also related to a method for reading magnetoresistive memories. All of the above statements in connection with the device also fully apply in regard to the method, which will now be discussed.

With the objects of the invention in view there is also provided, a method for reading magnetoresistive memory cells in a magnetoresistive memory including an array of magnetoresistive memory cells respectively disposed in a plurality of rows and a plurality of columns, the magnetoresistive memory further including a bit line for each of the columns, the bit line being connected to first poles of the magnetoresistive memory cells belonging to a respective column, and the magnetoresistive memory further including a word line for each of the rows, the word line being connected to second poles of the magnetoresistive memory cells belonging to a respective row, the method includes the following steps:

step A) connecting a read voltage source to a second pole of a magnetoresistive memory cell to be read;

step B) evaluating a voltage, which drops across a first terminating resistor, with a voltage evaluator, with the first terminating resistor and a first input of the voltage evaluator being connected to a first pole of the magnetoresistive memory cell to be read; and step C) applying the voltage, which drops across the first terminating resistor, also to an input of an impedance converter, and applying a voltage at an output of the impedance converter to word lines and bit lines not connected to the magnetoresistive memory cell to be read.

In other words, the invention is directed to a method for reading memory cells in a magnetoresistive memory which includes an array of magnetoresistive memory cells in a plurality of rows and/or a plurality of columns, a bit line for each of the columns, which is connected to first poles of memory cells belonging to the column, and a word line for each of the rows, which is connected to second poles of the memory cells belonging to the row, which method includes the following steps:

A: Apply a read voltage source to the second pole of a memory cell that is being read;

B: Evaluate the voltage which drops across the first terminating resistor with the aid of a voltage evaluator which is parallel to the first terminating resistor; whereby the first terminating resistor and a first input of the voltage evaluator are connected to the first pole of the memory cell being read;

C: Apply the voltage which drops across the first terminating resistor also to the input of an impedance converter, and apply the voltage at the output of the impedance converter to the word and bit lines which are not connected to the memory cell being read.

The inventive method takes advantage of the principle of the voltage splitter, according to which, on the basis of a known read voltage and a known terminating resistor, a defined voltage drop sets in, both across the terminating resistor and across the voltage evaluator and the impedance converter. While the voltage evaluator performs a measurement of the present voltage in order to be able to deduce the resistance value of the memory cell which is being read, the impedance converter makes its output signal low-impedance but maintains an identical voltage to the input signal, and can thus drive the various bit lines and word lines with its interposed resistance memory cells. Because the voltages which are so applied to the poles of the memory cells equal that at the bit line voltage that is connected to the memory cell being read, there is no current flow on the bit line at which the memory cell being read is holding, besides the flow through the memory cell being read. On the other hand, current flow does occur at the other memory cells belonging to the word line, which is also connected to the memory cell being read, and this current flow must be carried by the amplifier. Overall, the stability and precision of the read process can be substantially improved by this configuration.

Thus, the output voltage of the impedance converter should be identical to its input voltage. Deviations from this lead to degradation of the measurement result and interfere with the reliable determination of the binary value of the memory cell, which is being read.

The successive explication of the steps of the inventive method does not constitute a time sequence. Though the steps may be carried out in succession, a reliable evaluation by the voltage evaluator requires that all conditions, which must be brought about by the steps first be guaranteed, before reliable measurement is possible. It is therefore preferable, for reasons of practicability as well as speed, to execute the steps A, B and C substantially simultaneously.

The evaluation conducted in step B can include the following substeps:

B1: Connect the bit line which is connected to the memory cell being read to the first input of the voltage evaluator, the first terminating resistor, and the input of the impedance converter, by way of an evaluator line; and B2: determine the voltage at the first input in the voltage evaluator.

As described above, the inventive method can also be further refined in order to improve the precision of the value determination of the memory cells being read. It is possible to carry out two independent read operations, in which the emerging voltages are intermediately stored in two capacitors that are connected parallel to inputs of the voltage evaluator. The voltage values so stored can then ultimately be evaluated together in the voltage evaluator. But it is also possible to improve the method to the effect that the two read operations are performed in succession, and a changeover or switching operation is carried out in between. The advantage of this is that the measurement of the voltages need not be so precise, since this technique is geared more toward potentially emerging differences of the voltages before and after the switching attempt. The method thus includes a first read operation, followed by a switching attempt, followed in turn by a second reading of the voltage value. A preferred embodiment of this multi-step method includes the following additional steps:

D: store the voltage dropping across the first terminating resistor in first and third capacitors, which are connected to the first input of the voltage evaluator and the input of the impedance converter (whereby the third capacitor is naturally disposed near the impedance converter, and the first capacitor is disposed near the voltage evaluator);

E: disconnect the first input of the voltage evaluator and the first capacitor from the terminating resistor;

F: disconnect the input of the impedance converter and the third capacitor from the first terminating resistor;

G: disconnect the read voltage source from the memory cell that is being read;

H: disconnect the first terminating resistor from the memory cell that is being read;

I: apply the voltage at the output of the impedance converter to all word lines and bit lines;

J: apply a first current source to the word line which is connected to the second pole of the memory cell that is being read;

K: apply a second current source to the bit line that is connected to the first pole of the memory cell that is being read;

L: disconnect the first current source from the word line that is connected to the second pole of the memory cell that is being read;

M: disconnect the second current source from the bit line that is connected to the first pole of the memory cell being read;

N: disconnect the voltage at the output of the impedance converter from the second pole of the memory cell being read;

O: disconnect the voltage at the output of the impedance converter from the first pole of the memory cell being read;

P: connect the bit line that is connected to the memory cell being read to the second input of the voltage evaluator, the second terminating resistor, and the input of the impedance converter, by way of the evaluator line;

Q: apply the read voltage source to the second pole of the memory cell being read;

R: store the voltage which drops across a second terminating resistor in a second capacitor, which is parallel to the second terminating resistor, whereby the second terminating resistor, the second capacitor and a second input of the voltage evaluator are connected to the first pole of the memory cell being read;

S: compare the voltages stored in the first and second capacitors in the voltage evaluator.

The above-described steps of the inventive method lead to a clear improvement of the evaluation quality. Here, as well, it is not necessary to perform all steps in succession, despite the sequential ordering given herein. Rather, it is also possible to execute various steps simultaneously or substantially simultaneously. It is expedient to execute the following steps or operations of the respective steps substantially simultaneously:

A–D;
E, F;
G, H;
I;
J, K;
L, M;
N–P;
Q, S.

Finally, the invention is directed to the utilization of an impedance converter to buffer a read voltage of a memory cell that is being read in a magnetoresistive memory, and to apply the buffered signal to word and bit lines of the magnetoresistive memory.

In other words, with the objects of the invention in view there is also provided, a method of operating a magnetoresistive memory, the method includes:

providing a magnetoresistive memory including an array of magnetoresistive memory cells respectively disposed in a plurality of rows and a plurality of columns, the magnetoresistive memory further including a bit line for each of the columns, the bit line being connected to first poles of the magnetoresistive memory cells belonging to a respective column, and the magnetoresistive memory further including a word line for each of the rows, the word line being connected to second poles of the magnetoresistive memory cells belonging to a respective row;

buffering a read voltage of a magnetoresistive memory cell to be read by utilizing an impedance converter; and applying a buffered signal to word lines and bit lines of the magnetoresistive memory.

Other features which are considered as characteristic for the invention are set forth in the appended claims.

Although the invention is illustrated and described herein as embodied in a magnetoresistive memory and a method for reading a magnetoresistive memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

As described above, it is possible to realize the invention with a simple evaluator with one input and a simple evaluation method. The double-read method, which will now be described in detail allows reliable evaluation despite the large variations in local cell resistance which are expected. This includes the following steps:

1. Read the cell status and store the information;
2. next, attempt to switch in a particular direction;
3. read the cell status and store the information again;
4. compare the results and evaluate.

First evaluation operation (FIG. 1): The proposed matrix is formed of m word lines 5$a$, 5$b$ and n bit lines 4$a$, 4$b$, with the selected word line 5$a$ being set to a prescribed potential (e.g. 1.2 V) by a voltage source U1 by way of a read distributor 13 and a switching element 6$a$. A further switching element 6$b$ is connected between the read distributor 13 and the word line 5$b$. The selected bit line 4$a$ is connected to potential GND through the use of a terminating resistor R1 over an evaluator line 10, an evaluator distributor 14, and switching elements 8$a$, 8$b$, 19, 21, so that the resulting BL (bit line) voltage is derived via the voltage splitter, this being formed of the cell resistance of the memory cell 3$a$ being read and R1. A voltage drop thus occurs across the cell resistance that must be characterized, whose value is determined by the size of the cell resistance (given a cell resistance of $10^5$ Ω and a current of 5 μA, the voltage drop equals 0.5 V, and thus the level equals approx. 0.7 V, at the selected bit line 4$a$). The precise bit line voltage is intermediately stored in a first capacitor C1, which is located in the evaluation region.

Figure 1:
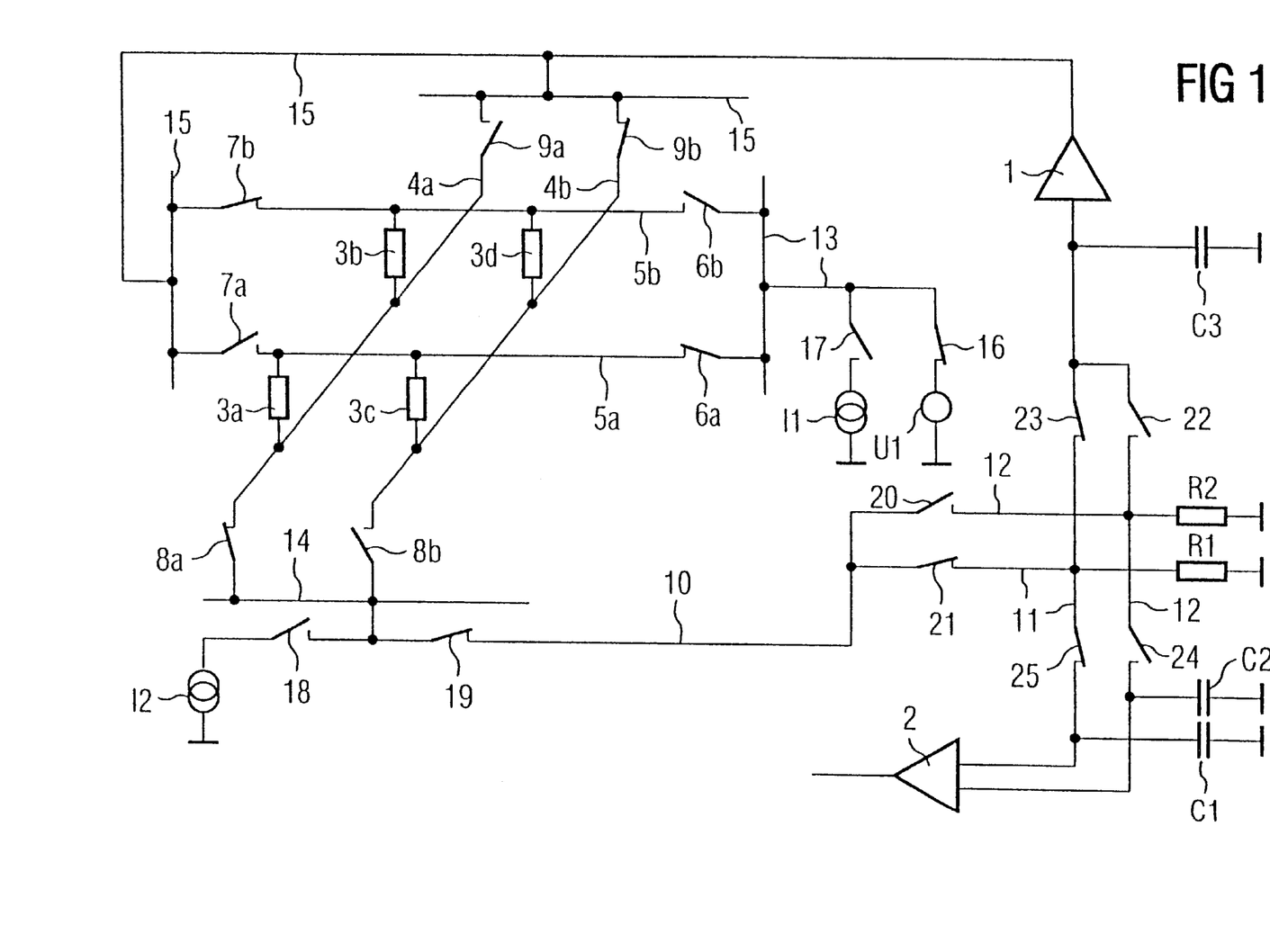
FIG. 1 is a circuit diagram of an embodiment of a magnetoresistive memory according to the invention during a first read operation.

If, according to the invention, only one evaluation operation is to be performed, the first capacitor C1 for intermediately storing the voltage is not needed. In this case, the voltage can be immediately determined through the use of a voltage evaluator 2 which is connected to the evaluator line 10 and otherwise connected parallel to the first capacitor C1 (i.e. both lie at the same potentials).

But if the inventive method with two read operations is to be utilized, the same voltage value is also intermediately stored in a third capacitor C3, since this voltage is needed for the subsequent write operation. All bit and word lines 4$b$, 5$b$, which are not addressed are held at the voltage of the addressed bit line 4$a$ (approx. 0.7 V) with the aid of an impedance converter 1 (V=1 amplifier) by way of a voltage distributor 15. Thus, in principle, unwanted cell currents emerge through unaddressed memory cells 3$b$, 3$c$, 3$d$ across unaddressed cells on the addressed word line 5$a$. These currents flow on unaddressed bit lines (in memory cell 3$c$ in FIG. 1, a cell current of approx. 5 μA per bit line emerges). They must be carried by the V=1 amplifier 1. Given 200 cells per word line, a current of 1 mA arises, which flows for 10 ns and dissipates an energy of 12 pJ. This current value is at the limit above which cells can be programmed. Arrays with a substantially larger number of cells per word line are therefore impossible. Still to be considered are charge currents of the bit line voltage, which can change 10–20% in accordance with the precise value of the cell resistance. The energy consumption required for this can be determined in simulation experiments.

The total value of the energy consumption of 12 pJ can be compared to that of a single-bit access of a DRAM, which requires an energy of approx. 200 pJ. Thus, in this case the energy consumption of DRAM is approximately one order of magnitude higher than that of MRAM. Other access types are imaginable, and thus other results as well. It is evident that problems with respect to power consumption of the read operation are not an issue for MRAM at the present time. The given voltage of approx 0.7 V is also the open-circuit voltage of the array. When a read operation occurs, only one word line is recharged. Power is thus saved.

Figure 2:
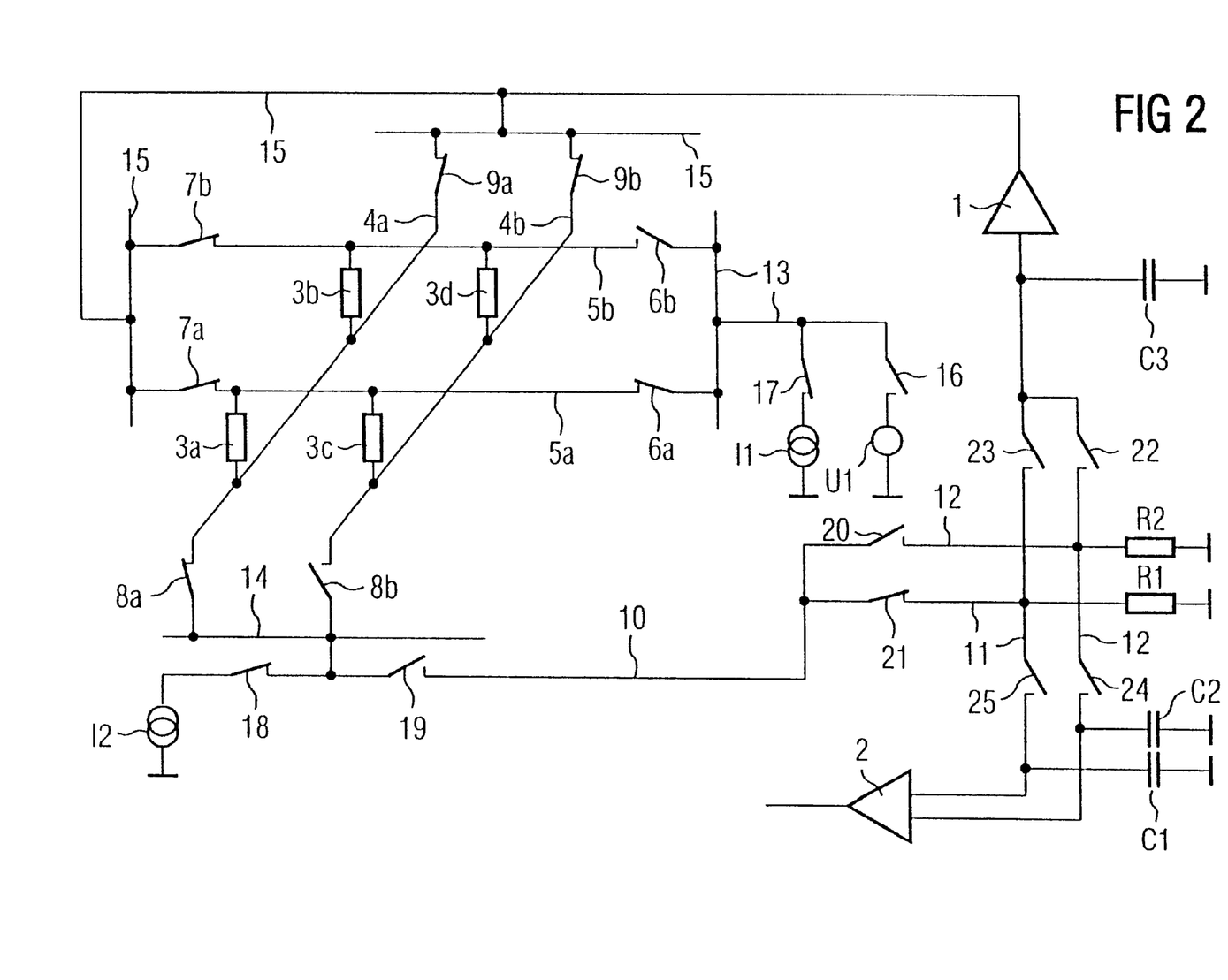
FIG. 2 is a circuit diagram of the same embodiment of the magnetoresistive memory according to the invention during the switching attempt.

Attempt to switch in a particular direction (FIG. 2; this operation substantially corresponds to the programming operation): The voltage value from the first evaluation is stored in the capacitors C1 and C3. The potential on C3 is now utilized as reference voltage and impressed in buffered form in all word lines and bit lines 4$a$, 4$b$, 5$a$, 5$b$ by way of the V=1 amplifier 1, which serves as voltage source, in that all switching elements 7$a$, 7$b$, 9$a$, 9$b$ which connect the voltage distributor 15 to the word lines and bit lines are closed. This saves power, since the cell field remains substantially at the same potential relative to the first read operation. In addition, a respective current is impressed in the selected bit line and word line 4$a$, 5$a$ by way of the write current sources I1 and I2, which reprograms the memory cell 3$a$ that is being read, provided that the status of the cell 3$a$ and the current directions permit it. The current is impressed by way of the current sources I1 and I2 in that the current sources are switched on by the switching elements 17 and 18 while the evaluator complex and the voltage source U1 are disconnected from the memory cell configuration by the switching elements 19 and 16, respectively. The current strengths of the current sources I1 and I2 are in the range of approx. 1 mA. The currents are impressed into the word line 5$a$ and bit line 4$a$ by the write current sources I1 and I2 and taken up by the impedance converter 1, which functions as a voltage source.

Second evaluation operation (FIG. 3): From the first evaluation, the appertaining voltage value is again stored in the first capacitor C1. An evaluation like the first evaluation then occurs, but the corresponding voltage value is now stored in a second capacitor C2. To this end, the evaluator line is subdivided into a terminal line 10 and two evaluator paths 11 and 12, which are separately connectable to the terminal line 10 with the aid of switching elements 20, 21. Each evaluator path contains a terminating resistor R1, R2 and a capacitor C1, C2, which are disconnectable from their terminating resistors through the use of switching elements 24, 25. In this configuration, which also includes branchings to the impedance converter with switching elements 22, 23, two independent measuring strands are realized, which allow two independent measurements. Next, the voltage evaluator 2 makes the decision by comparing the voltages, which are stored in the capacitors C1 and C2.

Figure 3:
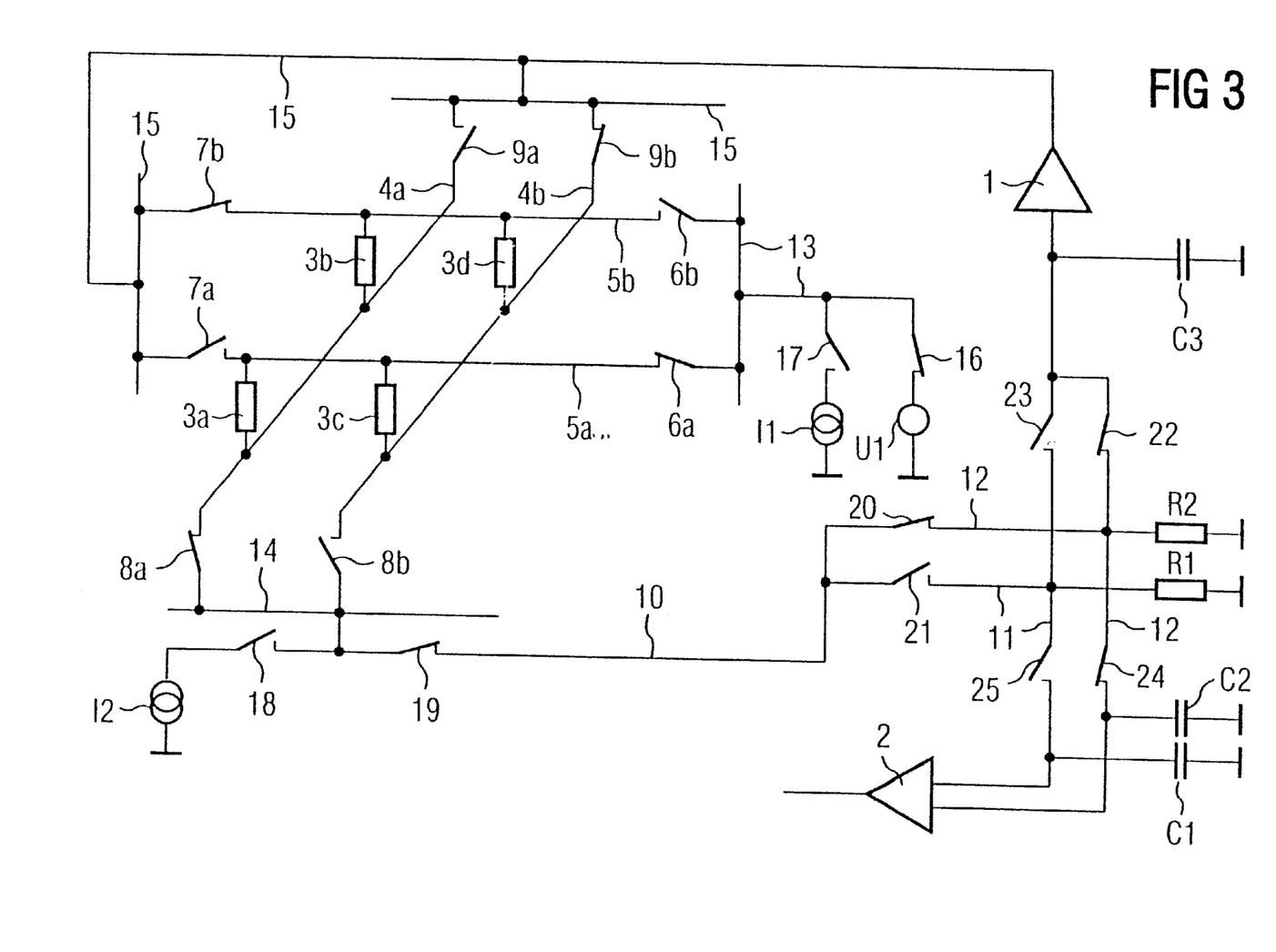
FIG. 3 is a circuit diagram of the same embodiment of the magnetoresistive memory according to the invention during a second read operation.

In any case, an asymmetry should be built into the system, since the programming attempt can either be successful or can lead to no modification of the cell content of the memory cell 3a being read. The asymmetry can be realized in the two terminating resistors R1, R2 or by an asymmetrical construction of the voltage evaluator 2. The result of the evaluation can subsequently be tapped at the output of the voltage evaluator 2.

The access time of the inventive circuit will now be estimated. For a cell resistance of $10^5$ Ω and a cell capacity of 10 fF, the charge time constant for the addressed cell in the read operation is 1 ns. The system has a second time constant, namely that for charging a line. Assuming an internal resistance of 100 Ω for voltage source U1, given a line with 10 pF (1000 cells), the time constant is again 1 ns.

Both time constants are in a favorable range. An evaluation time, which is roughly comparable to DRAM seems achievable. Next, the characteristics of the impedance converter 1 (V=1) will be estimated. An offset of the impedance converter 1 leads to a shifting of the voltage on the bit line, since currents emerge through unaddressed cells of the addressed bit line. Assuming N=1000 cells per bit line, this effect is relatively strong. The offset voltage Δ reaches through the word line voltage $V_{WL}$ completely. However, it affects both evaluations equally, which leads to partial compensation. The read signal S is derived according to equation (1):

$$S = f(R)(N\Delta - V_{WL}) \qquad \text{Equation (1)}$$

where f(R) is a function of various resistances and is about 0.02 for the given relations. Assuming $V_{WL}=1.2$ V, the upper limit of Δ is 1.2 mV. Amplifiers with an offset of approx. 1 mV are easy to manufacture today and have a current consumption in the neighborhood of several mA given a correction time of several ns and an output current of several mA.

The voltage difference between the data items "0" and "1" can equal about 24 mV under the above conditions but can also equal some other value deriving from the circuit. A value of 24 mV is reasonably evaluatable. The advantage of the MRAM is that the evaluation circuit is not subjected to the space limitations of the pitch region, since it can easily be placed outside the cell field.

We claim:

1. A magnetoresistive memory, comprising:
    magnetoresistive memory cells having respective first poles and second poles and being disposed in an array formed by rows and columns;
    bit lines assigned to said columns, said bit lines being connected to said first poles of said magnetoresistive memory cells disposed in associated ones of the columns, said bit lines having first ends and second ends;
    word lines assigned to said rows, said word lines being connected to said second poles of said magnetoresistive memory cells disposed in associated ones of the rows, said word lines having first ends and second ends;
    a read voltage source;
    first switching elements connected such that said read voltage source is separately connectable to said first ends of said word lines via said first switching elements;
    an evaluation line;
    second switching elements;
    a voltage evaluator having at least one input, said at least one input being separately connectable, via said evaluation line, to said first ends of said bit lines by said second switching elements;
    a first terminating resistor branching from said evaluation line;
    third switching elements; and
    an impedance converter having an input connected to said evaluation line and having an output separately connectable to said second ends of said bit lines and said word lines with said third switching elements.

2. The magnetoresistive memory according to claim 1, wherein:
    said evaluation line includes a terminal line for providing a connection to said bit lines and includes two evaluation paths;
    fourth switching elements are provided such that said two evaluation paths are separately connectable to said terminal line by said fourth switching elements;
    said first terminating resistor branches from a first one of said two evaluation paths, a second terminating resistor branches from a second one of said two evaluation paths;
    each of said two evaluation paths is connectable to a respective input of said voltage evaluator and to a respective capacitor, connected in parallel thereto, by a respective fifth switching element; and
    each of said two evaluation paths is connectable to said input of said impedance converter and to a further capacitor, connected in parallel to said input of said impedance converter, by a respective sixth switching element.

3. The magnetoresistive memory according to claim 1, including:
    a first write current source separately connectable to said first ends of said word lines via given ones of said first switching elements and via a fourth switching element; and
    a second write current source separately connectable to said first ends of said bit lines via given ones of said second switching elements and via a fifth switching element.

4. The magnetoresistive memory according to claim 1, including an evaluator distributor connecting said bit lines to said evaluation line via given ones of said second switching element provided for each of said bit lines.

5. The magnetoresistive memory according to claim 3, including an evaluator distributor for connecting said bit lines to said second write current source, and said second write current source and said evaluation line being connectable to said evaluator distributor via further switching elements.

6. The magnetoresistive memory according to claim 1, including a buffer distributor for connecting said output of said impedance converter to said bit lines and said word lines via said third switching element provided for said bit lines and said word lines.

7. The magnetoresistive memory according to claim 1, including a read distributor for connecting said read voltage source to said word lines via given ones of said first switching elements provided for said word lines.

8. The magnetoresistive memory according to claim 3, including a read distributor connecting said read voltage source to said word lines via given ones of said first switching elements provided for said word lines, said read distributor further connecting said first write current source to said word lines, said first write current source and said read voltage source being connectable to said read distributor via a given one of said first switching elements and said fourth switching element.

9. The magnetoresistive memory according to claim 1, wherein said first, second, and third switching elements are transistors.

10. A method for reading magnetoresistive memory cells in a magnetoresistive memory including an array of magnetoresistive memory cells respectively disposed in a plurality of rows and a plurality of columns, the magnetoresistive memory further including a bit line for each of the columns, the bit line being connected to first poles of the magnetoresistive memory cells belonging to a respective column, and the magnetoresistive memory further including a word line for each of the rows, the word line being connected to second poles of the magnetoresistive memory cells belonging to a respective row, the method which comprises the following steps:

step A) connecting a read voltage source to a second pole of a magnetoresistive memory cell to be read;

step B) evaluating a voltage, which drops across a first terminating resistor, with a voltage evaluator, with the first terminating resistor and a first input of the voltage evaluator being connected to a first pole of the magnetoresistive memory cell to be read; and step C) applying the voltage, which drops across the first terminating resistor, also to an input of an impedance converter, and applying a voltage at an output of the impedance converter to word lines and bit lines not connected to the magnetoresistive memory cell to be read.

11. The method according to claim 10, which comprises providing the voltage at the output of the impedance converter to be equal to the voltage at the input of the impedance converter.

12. The method according to claim 10, which comprises performing the steps A), B), and C) substantially simultaneously.

13. The method according to claim 10, wherein step B) includes the following steps:

step B1) connecting a bit line, which is connected to the magnetoresistive memory cell to he read, to the first input of the voltage evaluator, the first terminating resistor, and the input of the impedance converter, by way of an evaluator line; and step B2) determining a voltage at the first input in the voltage evaluator.

14. The method according to claim 10, which further comprises:

step D) storing the voltage which drops across the first terminating resistor in first and third capacitors connected to the first input of the voltage evaluator and the input of the impedance converter;

step E) disconnecting the first input of the voltage evaluator and the first capacitor from the first terminating resistor;

step F) disconnecting the input of the impedance converter and the third capacitor from the first terminating resistor;

step G) disconnecting a read voltage source from the magnetoresistive memory cell to be read;

step H) disconnecting the first terminating resistor from the magnetoresistive memory cell to be read;

step I) applying the voltage at the output of the impedance converter to all of the word lines and the bit lines;

step J) connecting a first current source to a word line connected to the second pole of the magnetoresistive memory cell to be read;

step K) connecting a second current source to a bit line connected to the first pole of the magnetoresistive memory cell to be read;

step L) disconnecting the first current source from the word line connected to the second pole of the magnetoresistive memory cell to be read;

step M) disconnecting the second current source from the bit line connected to the first pole of the magnetoresistive memory cell to be read;

step N) disconnecting the voltage at the output of the impedance converter from the second pole of the magnetoresistive memory cell to be read;

step O) disconnecting the voltage at the output of the impedance converter from the first pole of the magnetoresistive memory cell to be read;

step P) connecting the bit line, which is connected to the magnetoresistive memory cell to be read, to a second input of the voltage evaluator, a second terminating resistor, and the input of the impedance converter, by way of an evaluator line;

step Q) connecting the read voltage source to the second pole of the magnetoresistive memory cell to be read;

step R) storing a voltage which drops across the second terminating resistor in a second capacitor connected in parallel to the second terminating resistor, wherein the second terminating resistor, the second capacitor, and the second input of the voltage evaluator are connected to the first pole of the magnetoresistive memory cell to be read; and step S) comparing voltages stored in the first and second capacitors in the voltage evaluator.

15. The method according to claim 14, which comprises performing step A), step B), step C), and step D) substantially simultaneously.

16. The method according to claim 14, which comprises performing step E) and step F) substantially simultaneously.

17. The method according to claim 14, which comprises performing step G) and step H) substantially simultaneously.

18. The method according to claim 14, which comprises performing step J) and step K) substantially simultaneously.

19. The method according to claim 14, which comprises performing step L) and step M) substantially simultaneously.

20. The method according to claim 14, which comprises performing step N), step O), and step P) substantially simultaneously.

21. The method according to claim 14, which comprises performing step Q) and step S) substantially simultaneously.

22. A method of operating a magnetoresistive memory, the method which comprises:

providing a magnetoresistive memory including an array of magnetoresistive memory cells respectively disposed in a plurality of rows and a plurality of columns, the magnetoresistive memory further including a bit line for each of the columns, the bit line being connected to first poles of the magnetoresistive memory cells belonging to a respective column, and the magnetoresistive memory further including a word line for each of the rows, the word line being connected to second poles of the magnetoresistive memory cells belonging to a respective row;

buffering a read voltage of a magnetoresistive memory cell to be read by utilizing an impedance converter; and applying a buffered signal to word lines and bit lines of the magnetoresistive memory.

* * * * *